United States Patent
Ahn et al.

[11] Patent Number: 6,049,660
[45] Date of Patent: Apr. 11, 2000

[54] SIMULATION METHOD IN LITHOGRAPHIC PROCESS

[75] Inventors: Chang Nam Ahn; Hee Bom Kim, both of Ichon, Rep. of Korea

[73] Assignee: Hyundai Electronics Industries Co., Ltd., Kyoungki-do, Rep. of Korea

[21] Appl. No.: 08/998,003

[22] Filed: Dec. 24, 1997

[30] Foreign Application Priority Data

Dec. 27, 1996 [KR] Rep. of Korea ........................ 96-73684
Dec. 5, 1997 [KR] Rep. of Korea ........................ 97-66345

[51] Int. Cl.[7] .................................................... G06F 9/455
[52] U.S. Cl. ......................................................... 395/500.34
[58] Field of Search ........................ 395/500.21, 500.22, 395/500.34, 500.35, 500.36, 500.2; 430/280.1, 325; 427/407.1

[56] References Cited

U.S. PATENT DOCUMENTS

| | | | |
|---|---|---|---|
| 5,240,813 | 8/1993 | Watanabe et al. | 430/280.1 |
| 5,538,833 | 7/1996 | Ferguson et al. | 430/325 |
| 5,644,390 | 7/1997 | Yasuzato . | |
| 5,655,110 | 8/1997 | Krivokapic et al. | 395/500.2 |
| 5,702,767 | 12/1997 | Peterson et al. | 427/407.1 |
| 5,717,612 | 2/1998 | Capodieci | 395/500.22 |
| 5,889,678 | 3/1999 | Inoue et al. | 395/500.21 |

OTHER PUBLICATIONS

Fu et al., Enhancement of Lithographic Patterns by Using Serif Features, Mar. 1991, pp. 2599–2603.
Crisalle et al., A Comparison of the Optical Projection Lithography Simulators in SAMPLE and PROLITH, Feb. 1992, pp. 14–26.
Archak et al., Modeling of Resolution Enhancement Processes in Lithography, Sep. 1995, pp. 309–314.
Qian et al., A New Scalar Planewave Model for High NA Lithography Simulations, Mar. 1994, pp. 45–48.

*Primary Examiner*—Kevin J. Teska
*Assistant Examiner*—Dan Fiul
*Attorney, Agent, or Firm*—Nath & Associates, PLLC; Gary M. Nath; Harold L. Novick

[57] ABSTRACT

A simulation method for simulating in a lithographic process is disclosed, and the method can expect a size of a resist pattern by obtaining a diffused aerial image model(DAIM) by determining a simplified model in a aerial image to represent a resist process without simulating full processes including a resist process, and then applying the DAIM to a threshold model.

8 Claims, 14 Drawing Sheets

0.25 μm Patterns
$\sigma_B = 0\,\mu m$, $E_{th} = 10.3$ mj/cm$^2$, Soft Bake = 85°C 0.20 μm Patterns
$\sigma_B = 0\,\mu m$, $E_{th} = 10.3$ mj/cm$^2$, Soft Bake = 85°C 0.25 μm Patterns
$\sigma_B = 0\,\mu m$, $E_{th} = 6.9\,mj/cm^2$, Soft Bake = 105°C 0.20 μm Patterns
$\sigma_B = 0\,\mu m$, $E_{th} = 6.9\,mj/cm^2$, Soft Bake = 105°C

SIMULATION METHOD IN LITHOGRAPHIC PROCESS

BACKGROUND OF THE INVENTION

1. Field of the Invention

This invention relates to a method for simulating in a lithographic process, and more particularly to a method for simulating in a lithographic process in which semiconductor device manufacturing process, light crystal diode (LCD) manufacturing process, and lithography (electron beam, or X-ray for example) are used.

2. Description of the Prior Art

Even though simulation technology of an optical lithography process had been developed posterior to the time that optical lithography was adopted in the semiconductor industry, its technology has been the main means by which it is necessary to reduce trial and error in a unit-process or new development, and to shorten its development term, since the efficiency is excellent in: the optimization of cell layout, the expectancy of optimized conditions in a complicated process, or in the fast treatment of a large amount of data.

An optical proximity effect correction(OPC) is essential to optimize a mask layout. It is the most common method used for performing optical proximity effect correction. When used, the mask layout is corrected so that the aerial image closely approaches the desired target layout where an aerial image intensity contour is regarded as the top view of a resist pattern.

This method is widely used because it provides more efficient and easy usage; however, there is a disadvantage in that the exactitude falls in the surrounding of resolution limit, and when patterns, whose type, size, and density differ from one another, exist on a mask with various shapes, it is very difficult to expect a patterning status while only the aerial image is used.

It should be noted that a proximity effect in the lithography process has optical and non-optical components. Since the OPC, generally, is the proximity effect correction for a full lithography process, it is not satisfied with the correction of the aerial image (i.e., pure optical component) and so the proximity effect by the resist process (i.e., the non-optical component) should be considered.

While the OPC including the resist process is most desirable in this field, the full process OPC is not usually considered since the resist process simulation belongs to difficult fields. Instead, in order to increase the exactitude of the OPC, a method taking proper proximity to the full process has actively been studied.

A proximate simulation method, which can obtain comparatively exact results without simulating the full process, and the results when this method is applied to a 1GD OPC, will be explained hereinafter.

There are various manners of simulating the lithography process and then analyzing the result thereof. One of them is a manner where full courses of the lithography process are simulated. The courses are broadly composed of 3 steps: 1) step for calculating the aerial image, 2) step for calling a latent image, 3) step for calculating a development course. (Refer to FIG. 1)

The aerial image is defined as an intensity distribution of light just prior to reaching the resist on a surface of a wafer, while the wafer is exposed as the mask is equipped in an exposure apparatus. In order to simulate the aerial image, a layout onto the mask and an exposure condition of the exposure apparatus (for instance, NA: Numerical Aperture, σ: Partial Coherence Factor) should be required as input parameters.

In the case that the resist is exposed by the aerial image, there are complications where each partial amount of light that is reflected from the surface, is absorbed onto the resist, or is reflected from a surface of the wafer substrate and then returned back to the resist. At this moment, the latent image, i.e., the intensity distribution of light which is absorbed onto the resist after exposure, is generated. Not only these resist characteristics (for instance, refractive index : Dill's A,B,C) but also parameters (for instance, albed, refractive index) representing the characteristics of the wafer substrate should be included in input parameters for simulating the latent image.

In the case of a chemical amplification resist, a photo acid generator (PAG) is resolved by energy absorbed in the resist, and acid is then produced. Next, the acid is passed through a diffusion course by a post exposure bake (PEB) which is the next process, then a non-protection group and then another acid is produced in response to a protection group. Subsequently, similar series of courses in which the acid is reacted to other non-protection group occur, and such a course is expressed as an amplification in the present invention. Thus, the non-protection group is finally dissolved by a developing solution and thereby forming the resist pattern.

In order to simulate a resist profile in such a manner, the PEB parameters (for instance, temperature, time) and development parameters (for instance, development speed, type and concentration of developing solution) should be provided therein.

A program for calculating the aerial image in commercial software has been well developed and a program for simulating the resist profile has been also developed. However, while the aerial image simulation is established based on an obvious theory, the resist process simulation is formed almost entirely on models and many input parameters are required so as to simulate the full cours. Accordingly, the full process simulation is not used much yet, since there are still disadvantages in that a long simulation time is required and the exactitude is not exact because a resist parameter is not known except for a minimum factor.

Accordingly, the major method used, instead of the full process simulation, is a manner of performing only the aerial image simulation and then expecting the experimental results using a threshold model. Here, the threshold model is an analysis method that more or less values, centering around any intensity (i.e., the threshold value) among intensity distribution of light obtained by the result of the aerial image simulation, determining an existence/non-existence of the pattern.

Namely, with this method, in a case of positive photo resist, the resist is dissolved by the developing solution and then exhausted in all at over the threshold value, while the resist is not dissolved by the developing solution and remains as a pattern. Thus, there is an advantage in that it is very simple and it does not take much time. In this manner, the energy level and pattern size (exactly, the aerial image size) are known by a threshold cutting of the aerial image.

FIG. 2 shows dense lines of 0.25 μm L/S, isolated lines I/L, and the intensity of the aerial image of isolated space I/S. In case that a threshold level is defined as 0.25 in a normalized intensity as indicated in FIG. 2, the exposure energy is in inverse proportion to the intensity. In this case, exposure mount is 4 times than the threshold exposure energy $E_{th}$. Thus, each dense line L/S, isolated line I/L, and a pattern size of the isolated space I/S belongs to image sizes: $W_{L/S}(\approx 0.20 \ \mu m)$, $W_{I/L}(\approx 0.25 \ \mu m)$, and $W_{I/S}(\approx 0.30 \ \mu m)$, respectively.

In a case of such threshold modeling, when a variety of the exposure energy is low or a defocus value is not high in a type of pattern, it is relatively possible to expect the exact expectancy. However, the in case that either the exposure energy is varied in a wide space, the defocus value is high, or the pattern's type and size vary, the expectancy differs with the experimental results. As described above, as it is very difficult for the threshold model of the aerial image to explain its expectancy of the experimental results in general circumstances, it has been widely used in this field due to the advantages that 1) only the calculation of the aerial image is enable to expect the experimental result, 2) usage manner is easy in comparison to the full process simulation since the model itself is very simplified, 3) the expectancy of the experimental results in a unsophisticated status is obtained within a short time.

Under these circumstances, the threshold model should have shown discrepancy with respect to the experimental results in order to explain the full process including the resist process by using the aerial image only. Further, the full process simulation serves little assistance in the optimization of the actual processes, since there is a burden that the speed is slow and a lot of input parameters must be inputted exactly.

SUMMARY OF THE INVENTION

It is an object of the present invention to solve the drawback involved in the prior art, and to provide a simulation method which can expect a resist pattern size to be used as a diffused aerial image model (DAIM) which is a simplified model replaceable with a resist process, without simulating a full process including a resist process.

In one aspect of the present invention, there is provided a simulation method in a lithography process, comprising the steps of: obtaining an aerial image by inputting exposure apparatus conditions and a mask layout in a resist process for I lines, equally treating the aerial image with an acid distribution being produced from a resist in an exposure process, and obtaining a diffused aerial image under consideration of that the acid is diffused in a post expose bake process, expecting a pattern size in accordance with the diffused aerial image is applied to a threshold model.

The diffused aerial image $I_d$ is obtained by the following equation $$I_0 \cong F^{-1}\left(e^{-\sigma_B^2 \frac{(\xi^2+\eta^2)}{2}} F(I_0)\right)$$

where $I_0$ is the aerial image and F, $F^{-1}$ represent Fourier transformation to $\xi$, $\eta$ space, inverse Fourier transformation from $\xi$, $\eta$ space, respectively, and $\sigma_B$ is a fitting parameter.

In another aspect of the present invention, there is provided a simulation method in a lithography process, comprising the steps of obtaining an aerial image by exposing a chemical amplification resist, equally treating the aerial image with an acid distribution being produced from a resist, and obtaining a diffused aerial image in a post expose bake process in consideration that the acid is diffused and amplified in a post expose bake process, expecting a pattern size in accordance with the diffused aerial image is applied to a threshold model.

The diffused aerial image $I_d$ is obtained by the following equation $$I_0 \cong F^{-1}\left(e^{-\sigma_B^2 \frac{(\xi^2+\eta^2)}{2}} F(I_0)\right)$$

where $I_0$ is the aerial image and F, $F^{-1}$ represent Fourier transformation to $\xi$, $\eta$ space, inverse Fourier transformation from $\xi$, $\eta$ space, respectively, and $\sigma_B$ is a fitting parameter.

BRIEF DESCRIPTION OF THE DRAWINGS

The above object and other features of the present invention will become more apparent by describing the preferred embodiment thereof with reference to the accompanying drawings, in which.

DETAILED DESCRIPTION OF THE PREFERRED EMBODIMENT

Figure 1:
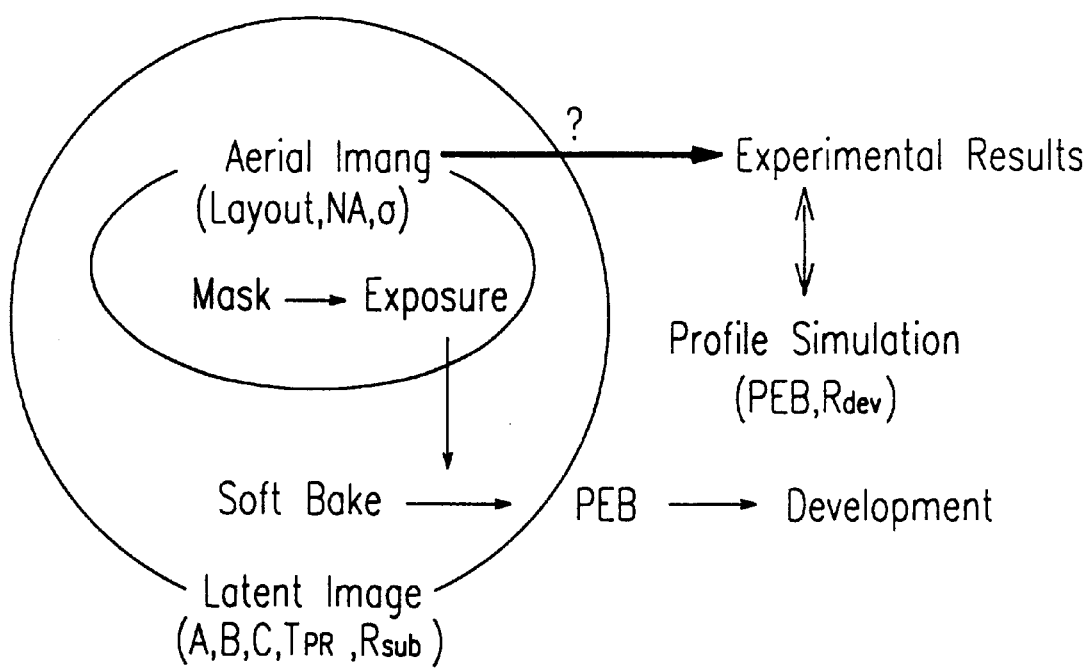
FIG. 1 is a simplified schematic diagram illustrating the interrelation of a lithographic process and simulation.

An aerial distribution of light, which is absorbed inside a resist on performing the exposure process, could not be explained only using an aerial image of two dimension and a defocus value, but has sophisticated distribution in three dimensions, in which multi-interference between a surface of a resist and a wafer substrate, should be considered.

Absorption of the exposure energy in three dimensions is the chief obstacle to approximate or quantify a resist process. If two aerial images, which have a defocus difference as much as a thickness of the resist since the resist thickness is sufficiently thin, are not quite different, the exposure energy distribution, which is absorbed inside of the resist only using the aerial image of two dimension of a focal plane, may be approximately represented even if the multi-interference is considered.

Thus, the preferred embodiment of the present invention suggests the following conditions.

The difference between an aerial image $I_0(f)$ in a focus f and an aerial image $I_0(f+T_{PR})$ in a focus $f+T_{PR}$ can be disregarded since the resist thickness $T_{PR}$ is sufficiently thin. Here, it is possible that the resist thickness is lower than 15,000 Å.

According to these conditions, the aerial image in two dimensions will be considered in the present embodiments.

It is well known that a chemical resist produces acid where a photo active generator (PAG) is broken by photon energy when the exposure process is performed. If we now define P and I to be normalized concentration of the PAG and intensity, respectively, variation of concentration caused by resolving the PAG during the exposure time t will be given by $$\frac{\partial P(x, y, t)}{\partial t} = -CI(x, y)P(x, y, t) \quad \text{Equation (1)}$$

where C is a proportionalconstant and is equivalent to the "C" quoted in the Dill.

The differential equation (1) will be easily solved by applying conditions that the intensity I is not a time function and an initial condition that the PAG is not even resolved before performing the exposure process. Since acid the amount of acid produced is as much as the amount that the PAG is resolved, if an acid is produced with respect to a PAG, the sum of the PAG concentration and acid concentration will be constant. Thus, a normalized concentration distribution $A_0$ of acid just after exposure may be written as $$A_0(x,y)=1-P(x,y,t=t_e)=1-e^{-CI(x,y)t_e} \quad \text{Equation (2)}$$

where $t_e$ is exposure time. Since total exposure energy E is obtained by multiplying the intensity I by total exposure time $t_e$. So Equation (2) may be replaced with $$A_0(x,y)=1-e^{-CE(x,y)} \quad \text{Equation (3)}$$

If the normalized intensity distribution $I_0$ is introduced, the intensity I will be replaced with $I=iI_0$ wherein, i is defined as a proportional constant since the intensity I is represented as constant times. So, Equation (2) may be now replaced with $$A_0(x,y)=1-e^{-\alpha I_0(x,y)} \quad \text{Equation (4)}$$

where $\alpha$ is a new constant and is satisfied with an equation of $\alpha=Cit_e$.

The acid produced by the exposure process is diffused by the thermal energy during a post exposure bake (PEB) which is the next process. If a diffusion coefficient D of acid is treated as a constant, in accordance with Fick's 1st law, concentration A of the normalized acid during the PEB process may be written $$\frac{\partial A(x, y, t')}{\partial t'} = D\nabla^2 A(x, y, t') \quad \text{Equation (5)}$$

where t' is a variable representing the PEB time. The differential Equation (5) will be easily solved by applying Fourier transformation in both directions and determining proper boundary conditions. Symbols of $\xi$, n are defined as Fourier parameters.

$$F_{\xi,\eta} = \int\int dx\, dy\, e^{-i(\xi x+\eta y)} \quad \text{Equation (6)}$$

multiplied by $\xi$, n and then integrated. Thus, we obtain the relation $$A(x, y, t') = F_{x,y}^{-1}\left(e^{-\sigma^2\frac{(\xi^2+\eta^2)}{2}}F_{\xi,\eta}(A_0(x', y'))\right) \quad \text{Equation (7)}$$

where F, $F^{-1}$ represent Fourier transformation from x', y' space to $\xi$, $\eta$ space to x, y space, respectively, and x', y' and x, y are initial space and final space, respectively. At this stage, diffusion length in the PEB time t' is defined as $$\sigma = \sqrt{2Dt'}$$

Thus, diffusion length just after the PEB process becomes $$\sigma_B = \sqrt{2Dt'_B}$$

where $t_B'$ is total PEB time.

Acid produced by the exposure energy is diffused by the thermal energy produced in the PEB process as described above and serves the role of breaking the protection group, concurrently. The breaking protection group is dissolved by a developer in a development process and thereby forming the pattern. Variation amount of the normalized concentration M of the protection group may be written:

$$\frac{\partial M(x, y, t')}{\partial t'} = -C'\exp\left(-\frac{\varepsilon_A}{k_B T}\right)A(x, y, t')^m M(x, y, t') \quad \text{Equation (8)}$$

where C is the proportional constant, and $\epsilon_A$ as a Boltmann factor, $k_B$, and T in the exponential terms are activation energy of the protection group, Boltmann constant, and PEB temperature, respectively. Also, m, which is usually defined as "1", is a reaction degree of acid, and can be regarded as the number of acid for breaking one protection group.

Equation (8) will be easily solved since a function of time t' has only M and A. If, now let N to be the normalized concentration of the protection group broken after performing the PEB, since summed value with M is maintained, the concentration N may be given by $$N(x, y) = 1 - M(x, y, t' = t'_B) \quad \text{Equation (9)}$$

$$N(x, y) = 1 - \exp\left[-\beta D\int_0^{t'_B} A(x, y, t')dt'\right]$$

$$N(x, y) = 1 - \exp\left[-\beta D\int_0^{\sigma_B} A(x, y, \sigma)\sigma d\sigma\right]$$

-continued $$N(x, y) = 1 - \exp\left[-\frac{1}{2}\sigma_B^2 \beta S(x, y)\right]$$

where $\beta = C'/D \exp(-\epsilon_A/k_B T)$ is another constant with no relation to time and space, and S is a normalized space average of acid within the diffused length. So, if Equation (7) is substituted into Equation (9), we obtain $$S(x, y) = \frac{2}{\sigma_B^2} \int_0^{\sigma_B} A(x, y, \sigma) \sigma d\sigma \qquad \text{Equation (10)}$$

$$S(x, y) = \frac{2}{\sigma_B^2} \int_0^{\sigma_B} F_{x,y}^{-1}\left(e^{-\sigma^2 \frac{(\xi^2+\eta^2)}{2}} F_{\xi,\eta}(A_0(x', y'))\right) \sigma d\sigma$$

$$S(x, y) = \frac{2}{\sigma_B^2} F_{x,y}^{-1}\left(\int_0^{\sigma_B} e^{-\sigma^2 \frac{(\xi^2+\eta^2)}{2}} \sigma d\sigma F_{\xi,\eta}(A_0(x', y'))\right)$$

$$S(x, y) = \frac{2}{\sigma_B^2} F_{x,y}^{-1}\left(\frac{1 - e^{-\sigma^2 \frac{(\xi^2+\eta^2)}{2}}}{\xi^2 + \eta^2} F_{\xi,\eta} A_0(x', y'))\right)$$

It is very difficult for a course developing from top to bottom of the resist to be expressed by an analytic equation: though normally it approaches in a manner having a numerical value. However, in a case where the thickness of resist is very thin, it can be considered as a two dimensional plane as assumed in the above. In such a case, the boundary of the pattern is formed along the contour which is equal to breaking the degree of the protection group. In the case of considering the resist thickness, if development contrast γ of the resist is very high, it is considered that the pattern is formed along the contour which is equal to breaking the degree of the protection group as same as in the case of thin resist. Thus, as described hereinafter, it is possible to approximately approach with respect to development course, as described above.

In the development course, the resist is dissolved at more than any constant value (threshold concentration: $N_{th}$) by the developer in the non-protection concentration distribution N made from breaking the protection group, while the resist remains without dissolving at less than the constant value. Namely, the pattern is formed along the contour of $N_{th}$.

It is possible that the threshold concentration $N_{th}$ of the-non-protection group is related to the threshold value of the exposure energy (i.e, threshold exposure dose: $E_{th}$), and it can be easily assumed that when black exposure is performed as much as $E_{th}$, it directly becomes $N_{th}$ concentration. In a case where parameters are well known among the chemical amplification resists. Since values of C and $E_{th}$ have about 0.001 (mJ/cm$^2$)$^{-1}$ and about 10 mJ/cm$^2$, respectively, $CE_{th}$ is too small. So, proximity may have the relation $$1 - e^{-CE_{th}} \cong CE_{th} \qquad \text{Equation (11)}$$

Thus, from Equations (3 and 9), we obtain the relation as $$N_{th} \cong 1 - \exp\left[-\frac{1}{2}\beta\sigma_B^2 CE_{th}\right] \qquad \text{Equation (12)}$$

Then, it is considered that the normal case is performed to $E_{th}$, and not the black exposure. The pattern's boundary, remaining after the development process is finished, is a portion of $N=N_{th}$, and E of this portion may have equal size of order for $E_{th}$ even though E in this portion is generally identical to $E_{th}$. Thus, we obtain the relation $$CE(\text{Pattern Boundary}) \cong CE_{th} < 1 \qquad \text{Equation (13)}$$

When Equation (3) or (4) is approximated by using Equation (13), if it is reminded that $A_0$ and $I_0$ are normalized, from the pattern's boundary, $$A_0 \cong I_0 \qquad \text{Equation (14)}$$

it may obtain Equation (14) and from Equation (10), the normalized space average S of acid within the diffused length will be given by $$S \cong \frac{2}{\sigma_B^2} F^{-1}\left(\frac{1 - e^{-\sigma_B^2 \frac{(\xi^2+\eta^2)}{2}}}{\xi^2 + \eta^2} F(I_0)\right) \qquad \text{Equation (15)}$$

where $I_0$ is the aerial image and F, $F^{-1}$ represent Fourier transformation to ξ, ηspace, inverse Fourier transformation from ξ, n, respectively, and $\sigma_B$ is a fitting parameter.

Equation (15) shows a relation where the aerial image intensity $I_0$ is transformed to acid concentration distribution S which is defined as a diffused aerial image $I_d$.

Since $I_0$ and S are normalized and have a linear relation, they have a one-to-one relation. The threshold model of the aerial image expect the pattern size only using $I_0$. It can be expected that there are very effective that if using S of Equation (15) instead of $I_0$, since the diffusion and amplification are already included, it approaches the resist process, since convenience using the threshold model as itself maintained.

A diffused aerial image model(DAIM) represents expectancy pattern states using Equation (15). Since $I_0$ value can be easily obtained by using a general simulation tool, and F, $F^{-1}$, which are Fourier transformation, inverse Fourier transformation, respectively, can be programmed in accordance with "Fast Fourier Transformation (FFT)" and thereby calculating S with ease.

Of course, when S is calculated using Equation (15), there is an unknown quantity $\sigma_B$ which corresponds to the diffusion length. In the DAIM, $\sigma_B$ is obtained from a simple experiment and then its resultant value is used after extending to the general case. Namely, $\sigma_B$ is used as the fitting parameter. It is expected that if the resist (i.e., resist's type, thickness, soft bake, PEB condition, and development recipe) are determined, $\sigma_B$ will be determined uniformly, if the recipe of the resist process are different, $\sigma_B$ will also have a different value.

Thus, it is more rational that $\sigma_B$ is not the diffusion length but a representative value for the recipe of the resist process.

Figure 2:
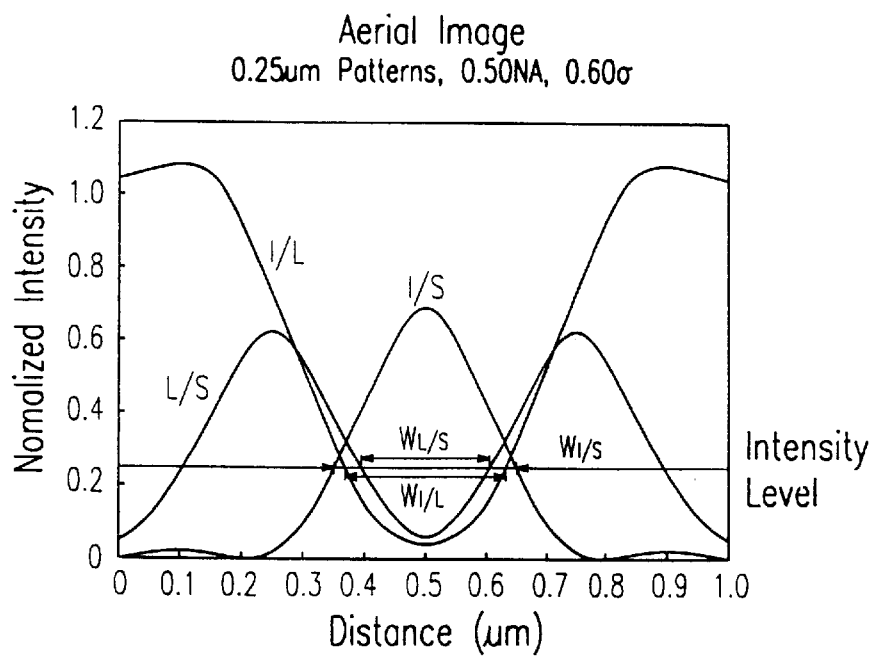
FIG. 2 is a graph illustrating the expectancy of pattern size in accordance with a threshold model as applied to an aerial image therein.
Figure 3:
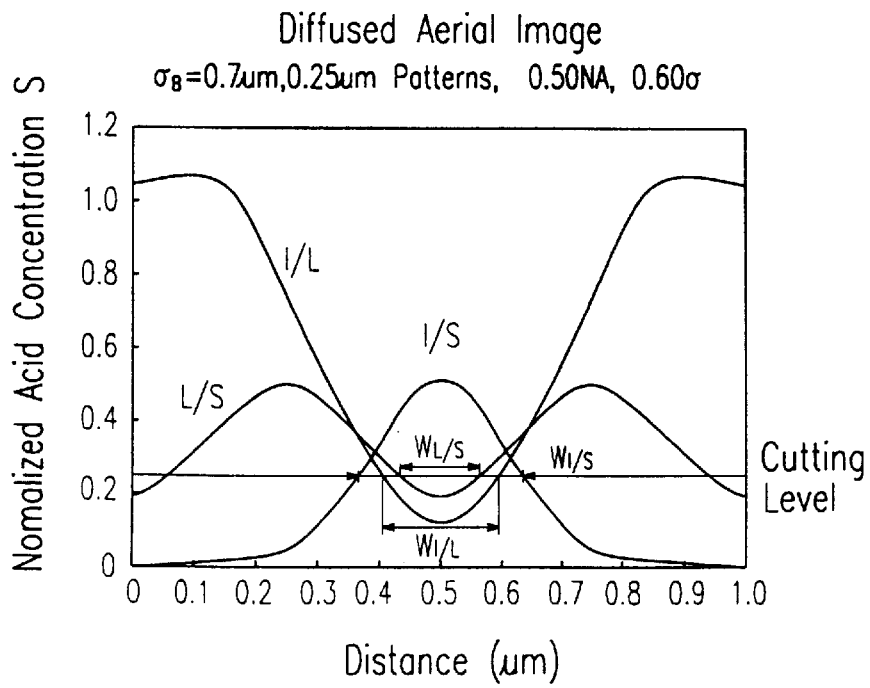
FIG. 3 is a graph illustrating expectancy of pattern size in accordance with a threshold model as applied to a diffused aerial image being obtained from the present invention.

FIG. 3 illustrates a diffused aerial image of 0.25 μm dense lines L/S, isolated lines I/S, and isolated space I/S after obtaining S from the aerial image depicted in FIG. 2 by using Equation (15), and in particular, shows a result when $\sigma_B$ is defined as 0.7 μm. If the cutting level is defined as 0.25 same as FIG. 2 case, the expected pattern sizes are $W_{L/S} \approx 0.16$ μm, $W_{I/L} \approx 0.21$ μm, and $W_{I/S} \approx 0.31$ μm and is somewhat different to the aerial image. Several embodiments utilizing the DAIM according to such manner will be described hereinafter.

Figure 4A:
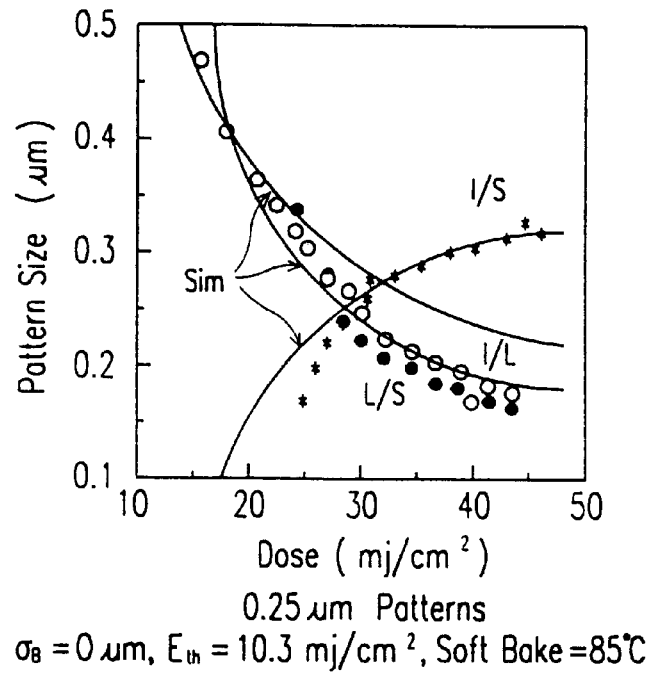
FIGS. 4A and 4B are graphs illustrating experimental comparison results of comparing pattern size with resist pattern which are obtained by applying an aerial image in a threshold model, while changing exposure energy.
Figure 4B:
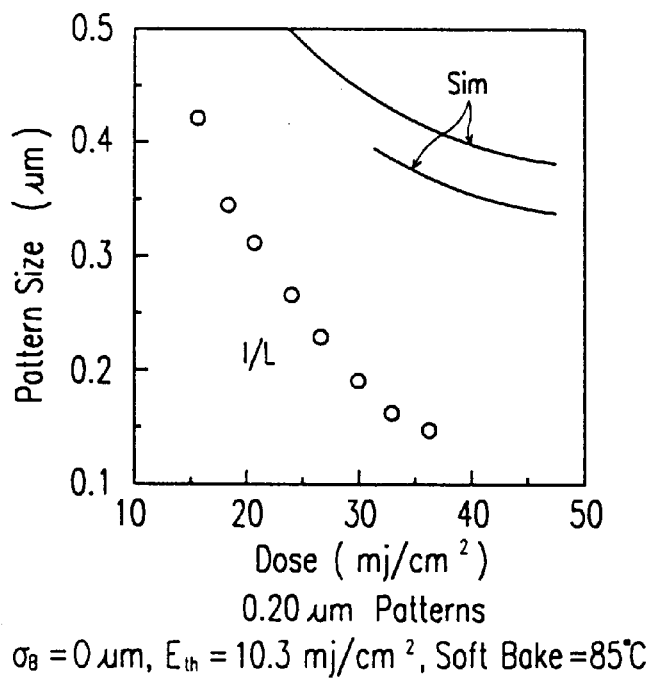

FIGS. 4A and 4B belong to cases of expecting the pattern size only using the aerial image, and illustrate both experimental results for pattern sizes (for instance, 0.25 μm in FIG. 4A and 0.20 μm in FIG. 4B) of dense lines L/S, isolated lines I/S, and isolated space I/S, and comparison results for each aerial image. In FIGS. 4A and 4B, and in other figures which are depicted hereinafter, a thin line and ⬤ represent patterns obtained by the simulation and experimental results when the resist pattern is formed, respectively. Here, $E_{th}$ is not an actual measurement value but a defined value so that aerial image size of 0.25 μm dense lines becomes 0.20 μm. It is not easy for the aerial image size to explain variation of the pattern size with respect to the variation of the exposure energy in the case where the pattern types are different, as depicted in FIG. 4A and in a type of pattern. Further, when patterns whose sizes are different exist concurrently as depicted in FIG. 4B (in the present embodiment, expectancy for 0.20 μm when is simulated base on 0.25 μm), the aerial image size is not even expected.

Figure 5A:
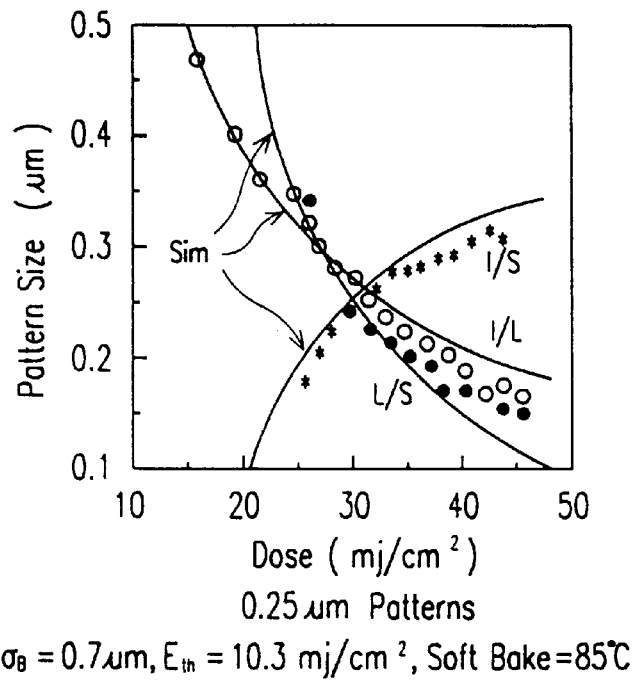
FIGS. 5A and 5B are graphs illustrating experimental comparison results of comparing pattern size with resist pattern which are obtained by applying a diffused aerial image in a threshold model, while changing energy.
Figure 5B:
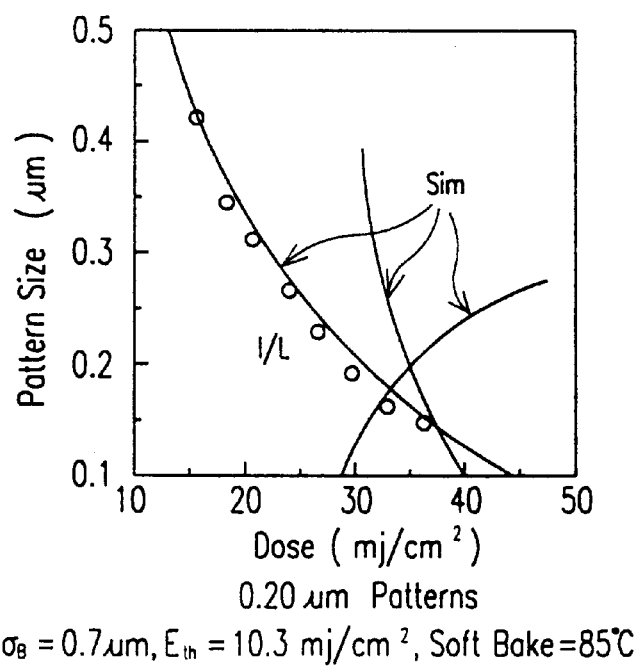
Figure 6A:
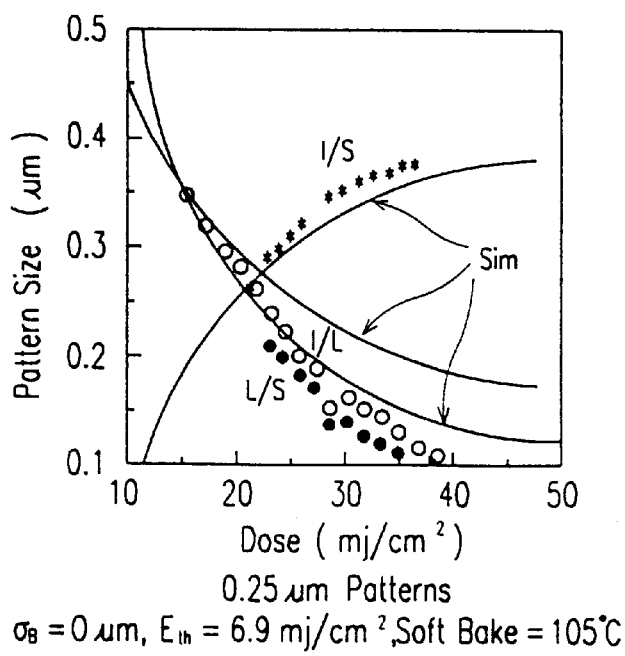
FIGS. 6A and 6B are graphs illustrating experimental comparison results of comparing pattern size with resist pattern which are obtained by applying an aerial image in a threshold model, while changing exposure energy.
Figure 6B:
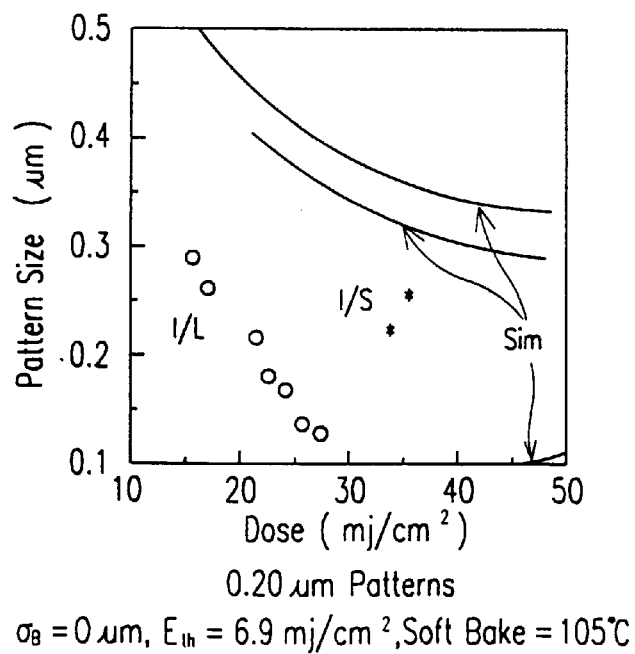
Figure 7A:
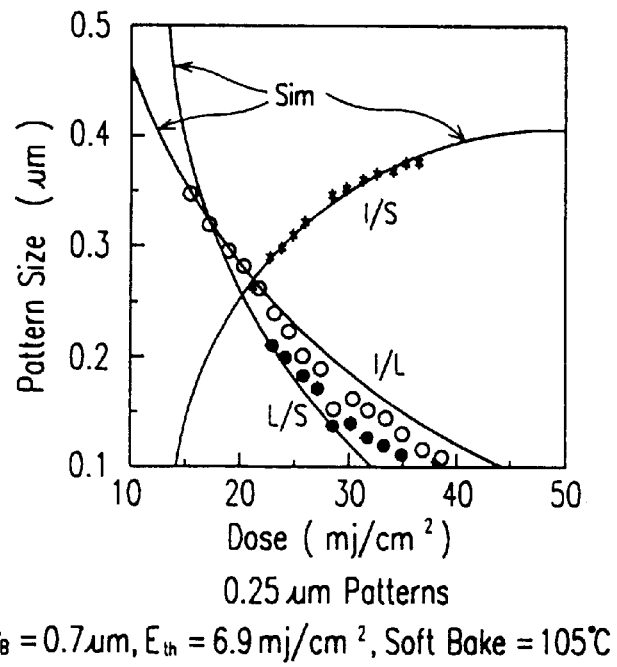
FIGS. 7A and 7B are graphs illustrating experimental comparison results of comparing pattern size with resist pattern which are obtained by applying a diffused aerial image in a threshold model, while changing energy.
Figure 7B:
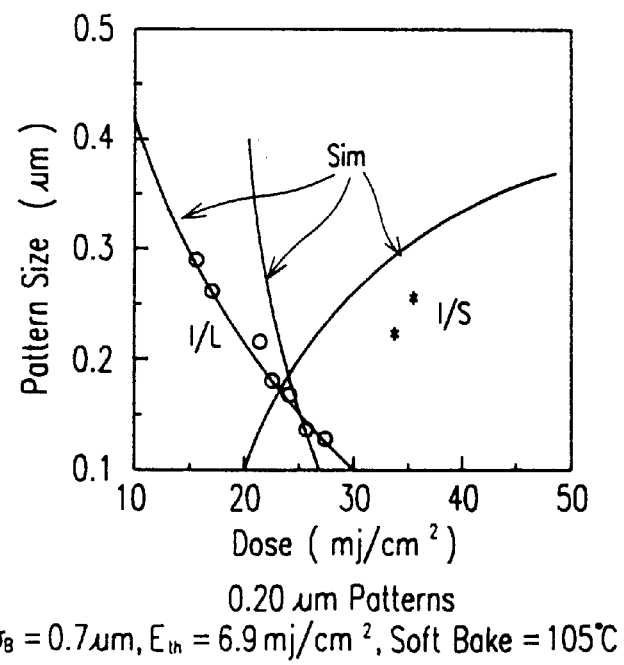

FIGS. 5A and 5B belong to cases of expecting the pattern size using the diffused aerial image, and illustrate both experimental results for pattern sizes (for instance, 0.25 μm in FIG. 5A and 0.20 μm in FIG. 5B) of dense lines L/S, isolated lines I/S, and isolated space I/S and comparison results for each aerial images. Of course, in the case of DAIM, even if it is not equal to the experimental results completely, it shows amazing improvement which is not comparable to a case of using only the aerial image.

Thus, the DAIM can be applied in case that the dense lines L/S, isolated lines I/S, and isolated space I/S exist concurrently and the size is spitted.

FIGS. 6A, 6B and 7A, 7B belong to cases of expecting the pattern size using the aerial image and the diffused aerial image, where soft bake condition is determined by 105° C., and illustrate both experimental results for pattern sizes (for instance, 0.25 μm in FIG. 6A and 7A and 0.20 μm in FIG. 6B and 7B) of dense lines L/S, isolated lines I/S, and isolated space I/S and comparison results for each aerial image.

It is noted that the result using the diffused aerial image as depicted in FIG. 7 is more superior to that obtained by only using the aerial image as depicted in FIG. 6. In this case, it is well known that if the soft bake temperature condition is changed, $E_{th}$ is also different, meaning that there is a possibility that the fitting parameter $\sigma_B$ will be changed in the DAIM since the recipe of the resist process is basically changed.

Even though the two cases well describe the experimental result using $\sigma_B$=0.7 μm, it does not mean that the diffusion length of acid is not changed even if the soft bake temperature is changed. To be exact, while $\sigma_B$ of the two case is different, it would be assumed that all fitting values, which are matched to the experimental results, are around 0.7 μm.

It is a general fact that the linearity of the pattern size is not granted in a contact hole pattern. So, when each size's contact hole is defined in cells and peripheral circuit area such as a poly 2 contact P2C or a metal 1 contact M1C, if the exposure is performed based on the cell, the size of the contact hole of the peripheral circuits will be much bigger.

Figure 8A:
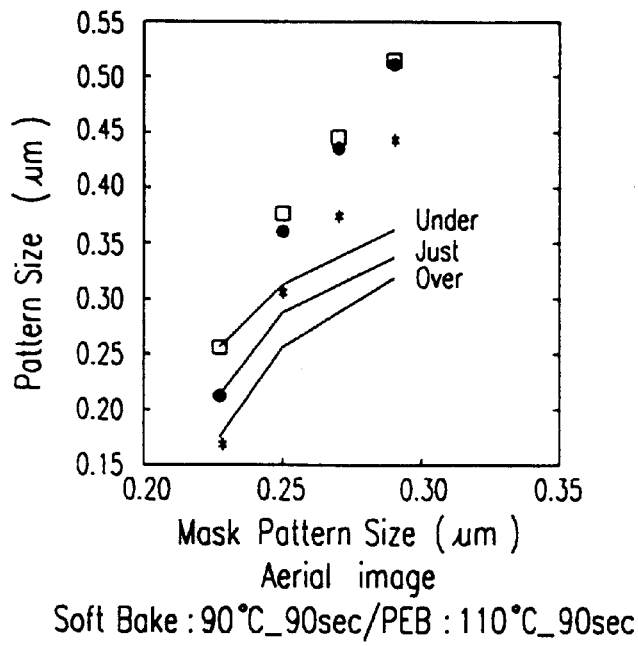
FIGS. 8A and 8B are graphs illustrating experimental comparison results of comparing pattern size with resist pattern which are obtained from an aerial image and a diffused aerial image, while forming a hole.
Figure 8B:
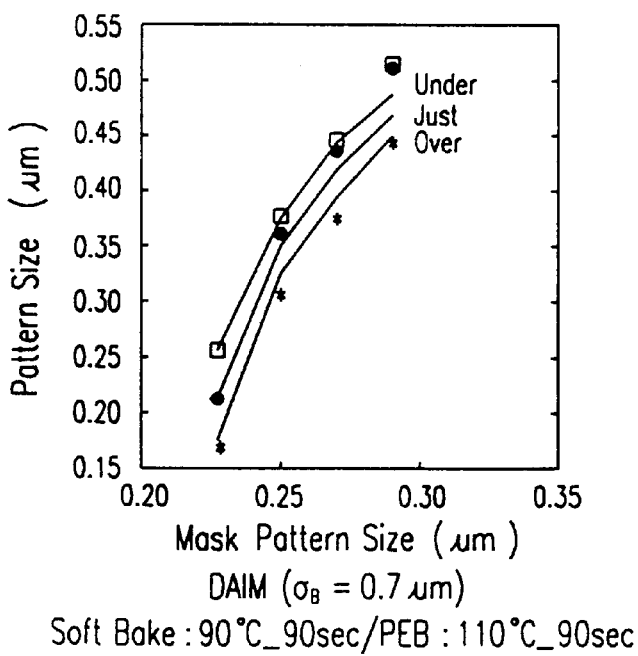

FIGS. 8A and 8B are graphs illustrating the linearity of the pattern size, and FIG. 4A and FIG. 4B belong to the cases of expected size only using the aerial image and of using the DAIM, respectively. When 0.225 μm contact hole is exposed without a bias, or is over or under exposed, the size of the DI pattern of the contact hole, which has mask pattern sizes of 0.25 μm, 0.275 μm, and 0.30 μm may be more than 1.5 times larger than is designed. In the case that the contact hole has other sizes which exist in a mask concurrently, if the DAIM is used, all corresponding sizes can be expected.

Thus, when the pattern size on the wafer is determined, it is easy to determine the size of the mask pattern which can be satisfied with this determination. Of course, differences of albed of the underlayer or influence caused by topology are not considered in the DAIM of the present embodiment.

In the case of i-line, the resist process does not have much difference with respect to the case of DUV basically studied above. It will be expressed simply due to the fact that the resist process is not the chemical amplification resist. Thus, it is acceptable that the diffusion of broken PAG is considered instead of the diffusion of acid, it is not necessary to consider the amplification. Thus, if it defines Ni to be the normalized concentration of broken PAG of the i-line, by applying the proximity relation of Equation (14) as it is, from Equation (7), we may obtain:

Equation (16)

$$Ni \cong F^{-1}\left(e^{-\sigma_B^2 \frac{(\xi^2+\eta^2)}{2}} F(I_0)\right)$$

When Equation (16) is applied, it is more suitable that $\sigma_B$ is not the diffusion length but that it is treated as the fitting parameter.

Figure 9A:
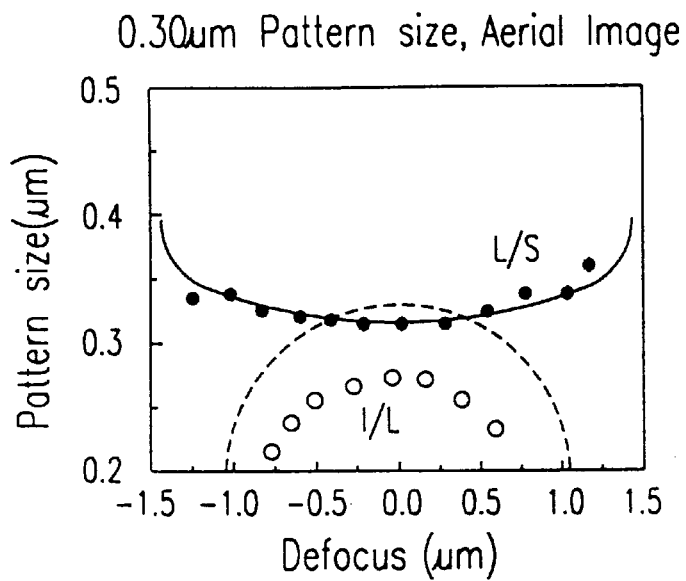
FIGS. 9A through 9F are graphs illustrating experimental comparison results of comparing pattern size with resist pattern which are obtained from an aerial image and a diffused aerial image, while defocus and pattern size are predetermined in different, respectively.
Figure 9B:
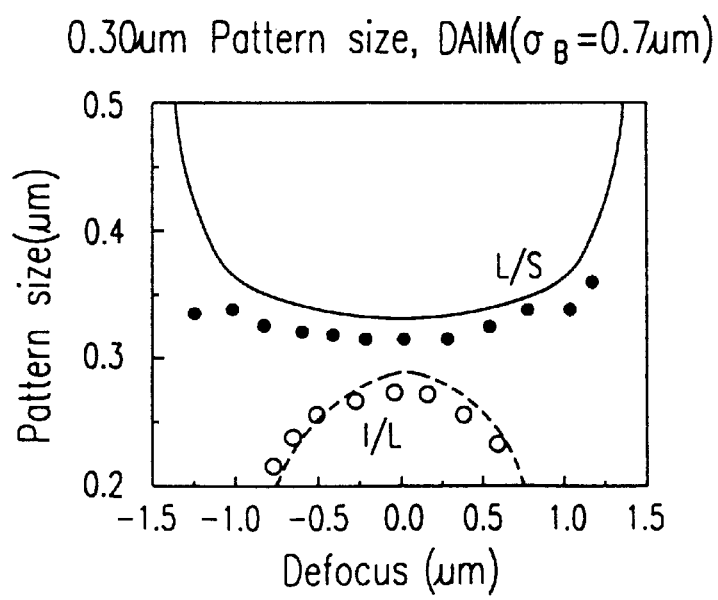
Figure 9C:
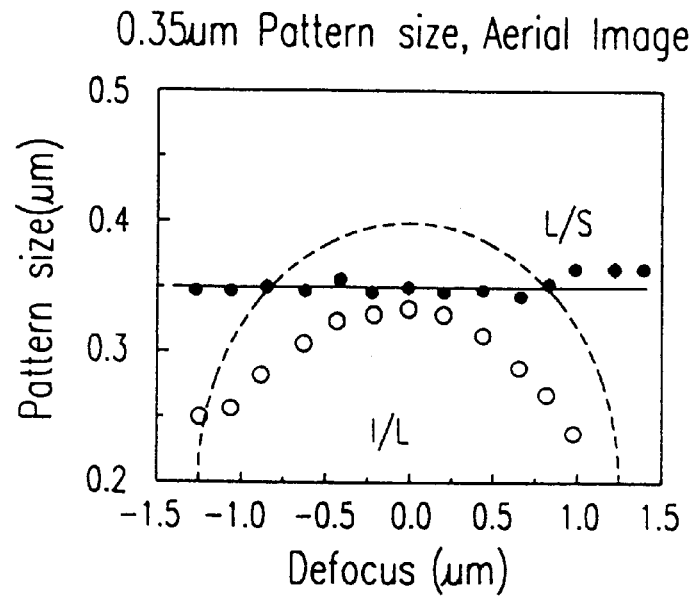
Figure 9D:
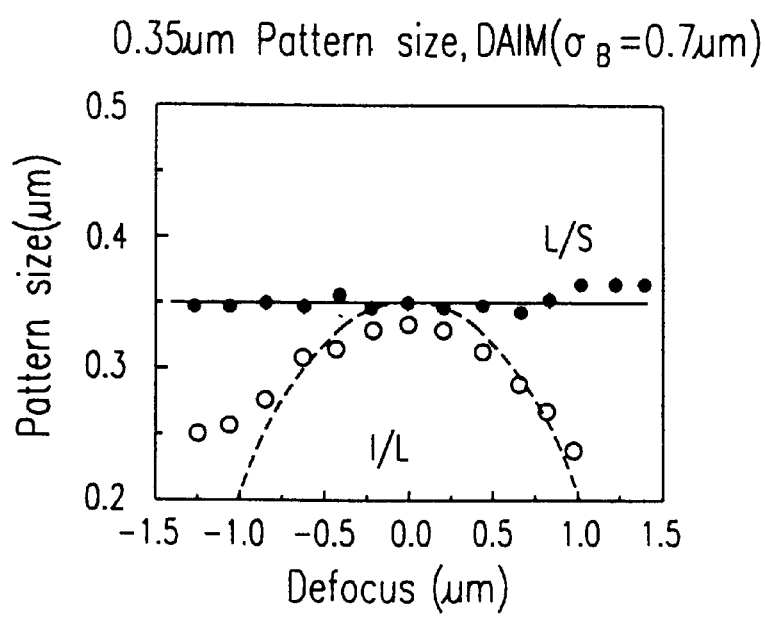
Figure 9E:
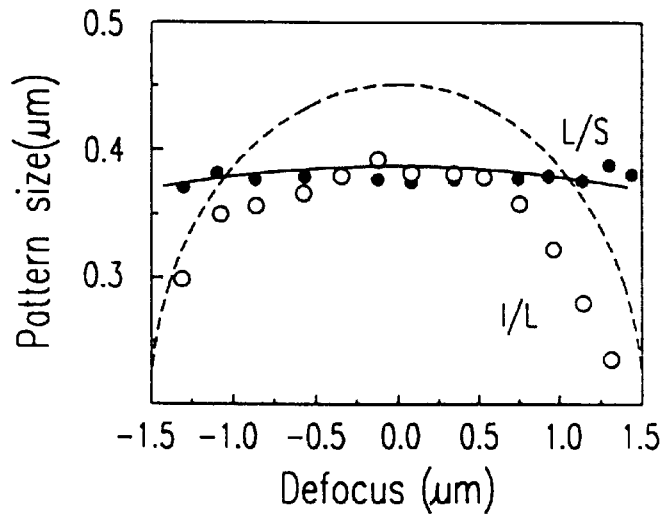

FIGS. 9A, 9C and 9E illustrate experimental results in accordance with the defocus when the pattern sizes are formed with 0.30 μm, 0.35 μm, 0.40 μm and a simulation pattern size is obtained by the aerial image.

Figure 9F:
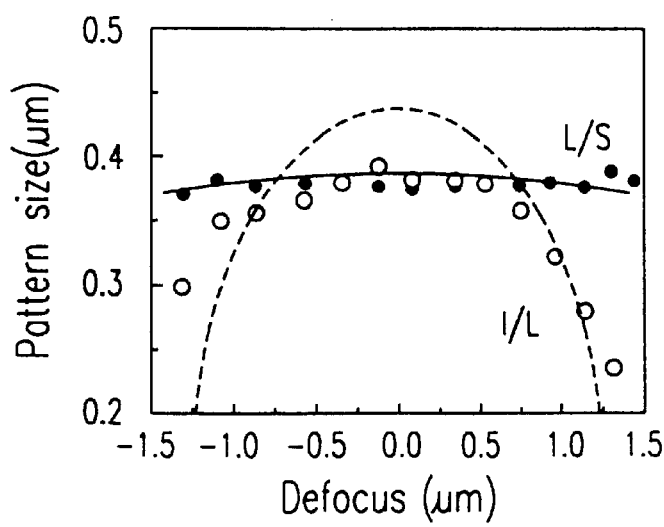

FIGS. 9B, 9D and 9F illustrate experimental results in accordance with the defocus when the pattern sizes are formed with 0.30 μm, 0.35 μm, 0.40 μm and a simulation pattern size is obtained by the diffusion aerial image.

According to the FIGS. 9A through 9F, it is noted that when the dense line L/S and the isolated line I/S patterns are defined using i-line, the simulation manner which the DAIM of the present invention is applied is more superior to that of only using the aerial image. Wherein, that made of the dotted lines represent patterns by the simulation and that depicted as ● represents experimental results where the resist pattern is formed.

Further, FIGS. 9A through 9F compare the aerial image simulation results with the DAIM simulation result for the variation of line width caused by the defocus, when the exposure energy is determined that 0.35 μm dense lines L/S is of no bias. In this case, it is noted that the reliability of the DAIM will fall since the development contrast of the case of i-line is not superior to that of the case of the DUV.

The following shows the extreme effectiveness of the DAIM clearly and is applied to the development of acctual device fabrication.

Figure 10A:
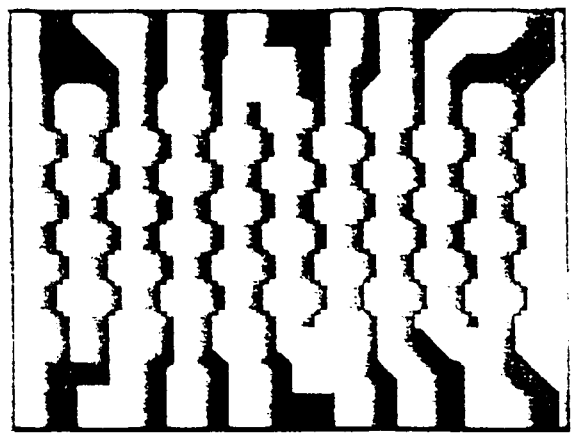
FIGS. 10A through 10D are simulation views utilizing formation of a resist pattern using some masks, an aerial image, and a diffused aerial image.
Figure 10B:
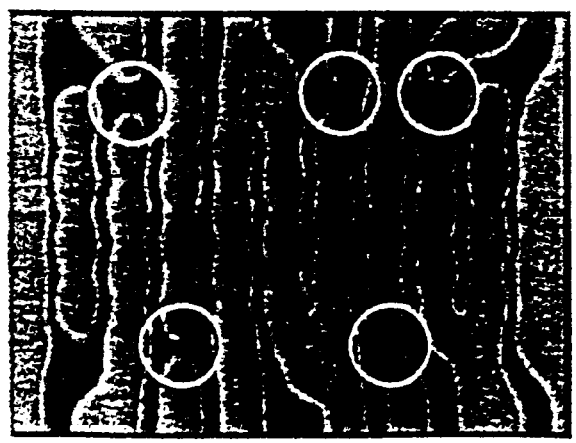
Figure 10C:
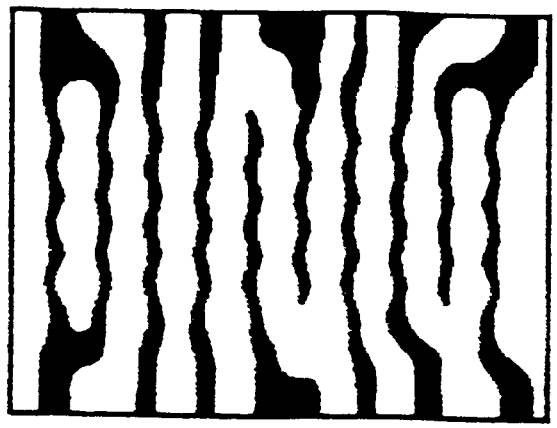
Figure 10D:
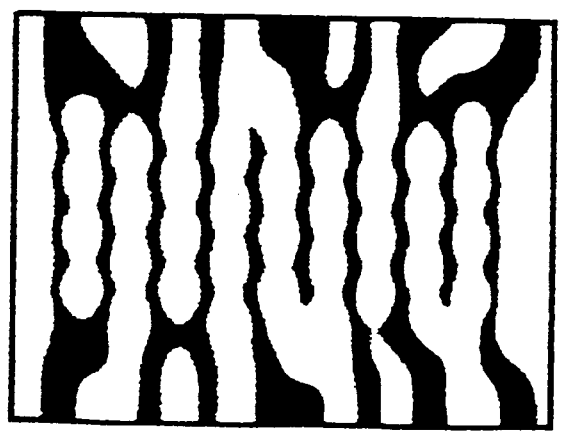

FIG. 10A illustrates a mask pattern, FIG. 10B is a top view, in which 5 bridges occur, pictured by critical dimension scanning electron microscope (CDSEM) when the resist pattern is formed using the mask depicted in FIG. 10A, FIG. 10C illustrates that any bridge is not shown when the simulation is performed by only using the aerial image. Also, FIG. 10D illustrate that the bridge occurrs when the simulation is performed by using the diffused aerial image.

According to FIGS. 10A through 10D, not only is it not easily expected that of 5 bridges as depicted in FIG. 10B by only using mask layout, that the simulation results for the aerial image can not explain the bridge phenomenon. While the simulation results of the aerial image is obtained from one focus and one energy, the experimental results cannot be explained even if the energy level and defocus are considered.

Figure 11A:
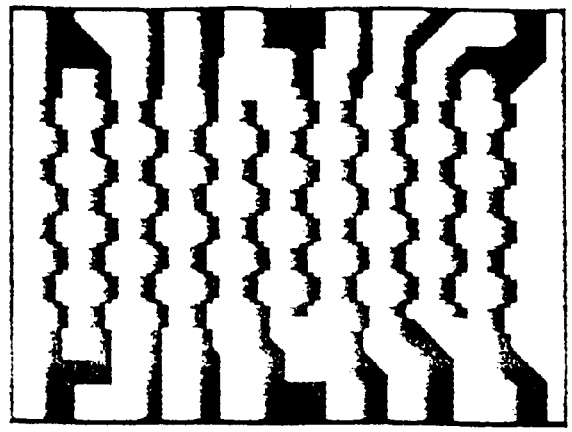
FIGS. 11A through 11D are simulation views utilizing formation of a resist pattern using fixed masks, an aerial image, and a diffused aerial image.
Figure 11B:
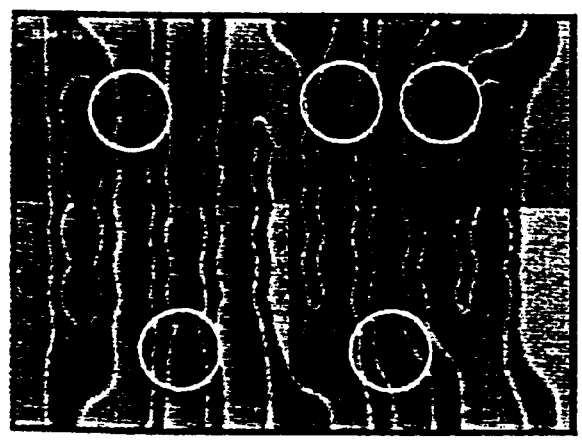
Figure 11C:
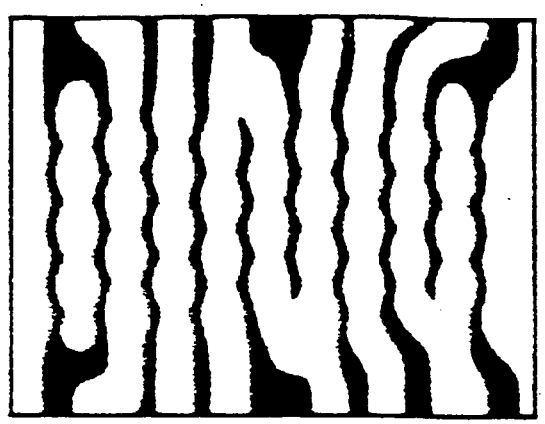
Figure 11D:
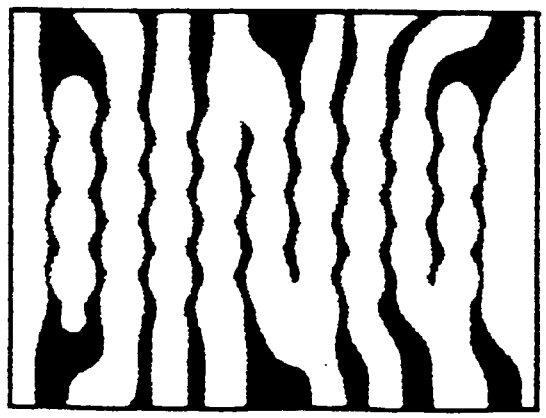

FIG. 11A illustrates a mask pattern, which is revised from the mask shown in FIG. 10A in accordance with the DAIM as applied therein, FIG. 11B is a top view, in which bridges do not occur, pictured by a CDSEM when the resist pattern is formed using the mask depicted in FIG. 11A, and FIG. 11C is a view of when the simulation is performed by only using the aerial image. Also, FIG. 11D is a view when the simulation is performed by using the diffused aerial image.

According to FIGS. 11A through 11D, not only the DAIM clearly explains the bridge phenomenon but also the result that relative difference of bridge degree is identical to the experiment is shown, thereby easily identifying the DAIM verification in an actual application. After that, the revision of poly 1 mask using the DAIM is very successful as depicted in FIG. 11.

As described above, the proximity effect of the optical lithography is divided an element causing diffraction of light and an element causing the resist process. While OPC which is generally referred means the correction of proximity effect stretching over the full lithography process, and a lot of simulation tools, which are being commercialized, consider the aerial image until now.

Accordingly, it can be insisted that the DAIM of the present invention is a suitable model to apply to the OPC, since it not only provides the type that Fourier transformation is added to the calculation of the prior aerial image, but also the calculating speed is almost maintained at a level of calculating the aerial image and the exactitude is more superior to the aerial image.

Further, the DAIM of the present invention provides several advantages as follows.

First, the theory described as above is well matched when the resist thickness is very thin.

Second, the most important point of the resist process is the diffusion of acid or broken PAG.

Third, the amplification is even considered in the chemical amplification resist.

Fourth, the concentration distribution of the non-protection group in the development process is developed along with the constant contour.

Fifth, the DAIM is expressed by the convolution of the aerial image linked with a term which represents the diffusion (Gaussian function) and the amplification (Gaussian integral type), mathematically.

The present invention has now been described with respect to a presently preferred embodiment with some descriptions of alternatives. However, additional embodiments and variations of the present embodiment would be apparent to those skilled in the art.

What is claimed is:

1. A simulation method in a lithography process, comprising the steps of:

obtaining an aerial image by inputting exposure apparatus conditions and a mask layout in a resist process for I-lines;

regarding said aerial image the same as an acid distribution being produced from a resist in an exposure process, and obtaining a diffused aerial image in consideration of diffusion of said acid in a post expose bake process;

applying said diffused aerial image to a threshold model, thereby modeling an expected resist pattern size.

2. The simulation method as defined in claim 1, said aerial image is obtained by the following equation $$I_0 \cong F^{-1}\left(e^{-\sigma_B^2 \frac{(\xi^2+\eta^2)}{2}} F(I_0)\right)$$

where $I_0$ is said aerial image and F, $F^{-1}$ represent Fourier transformation to $\xi$, $\eta$ space, inverse Fourier transformation from $\xi$, $\eta$ space, respectively, and $\sigma_B$ is a fitting parameter.

3. The simulation method as defined in claim 1, wherein said acid distribution is treated as that of two dimensions so that said aerial image is regarded the same as said acid distribution being produced from said resist.

4. The simulation method as defined in claim 1, wherein a thickness of said resist is determined to be less than 15,000 Å so that said aerial image is regarded the same as said acid distribution being produced from said resist.

5. A simulation method in a lithography process, comprising the steps of:

obtaining an aerial image by inputting exposure apparatus conditions and a mask layout in a resist process for I-lines;

regarding said aerial image the same as an acid distribution being produced from a resist in an exposure process, and obtaining a diffused aerial image in consideration of diffusion and amplification of said acid in a post expose bake process;

applying said diffused aerial image to a threshold model, thereby modeling an expected resist pattern size.

6. The simulation method as defined in claim 5, said aerial image is obtained by the following equation $$I_0 \cong F^{-1}\left(e^{-\sigma_B^2 \frac{(\xi^2+\eta^2)}{2}} F(I_0)\right)$$

where $I_0$ is said aerial image and F, $F^{-1}$ represent Fourier transformation to $\xi$, $\eta$ space, inverse Fourier transformation from $\xi$, $\eta$ space, respectively, and $\sigma_B$ is a fitting parameter.

7. The simulation method as defined in claim 5, wherein said acid distribution is treated as that of two dimensions so that said aerial image is regarded the same as said acid distribution being produced from said resist.

8. The simulation method as defined in claim 5, wherein a thickness of said resist is determined to be less than 15,000 Å so that said aerial image is regarded the same as said acid distribution being produced from said resist.

* * * * *